(12) United States Patent
Qawami et al.

(10) Patent No.: US 9,274,885 B2
(45) Date of Patent: Mar. 1, 2016

(54) PHASE CHANGE MEMORY WITH SWITCH (PCMS) WRITE ERROR DETECTION

(75) Inventors: Shekoufeh Qawami, El Dorado Hills, CA (US); Rajesh Sundaram, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 13/997,246

(22) PCT Filed: Dec. 30, 2011

(86) PCT No.: PCT/US2011/068139
§ 371 (c)(1),
(2), (4) Date: Nov. 21, 2013

(87) PCT Pub. No.: WO2013/101196
PCT Pub. Date: Jul. 4, 2013

(65) Prior Publication Data
US 2014/0317474 A1    Oct. 23, 2014

(51) Int. Cl.
*G11C 29/00* (2006.01)
*G06F 11/10* (2006.01)
*G06F 11/07* (2006.01)
*G11C 13/00* (2006.01)

(52) U.S. Cl.
CPC .......... *G06F 11/1048* (2013.01); *G06F 11/073* (2013.01); *G06F 11/0763* (2013.01); *G06F 11/1068* (2013.01); *G11C 13/0004* (2013.01)

(58) Field of Classification Search
CPC .............. G06F 11/073; G06F 11/1068; G06F 11/1048; G06F 11/0763; G06F 11/10; G11C 13/0004; G11C 29/52; G11C 29/028; G11C 16/3418; G11C 2029/0411; G11C 2029/0409; G11C 11/10; G11C 16/26; G11C 13/0023; G11C 13/0069; G11C 13/0064; G11C 13/0061; G11C 29/4401
See application file for complete search history.

(56) References Cited

U.S. PATENT DOCUMENTS

| 8,634,246 B2 * | 1/2014 | Kang et al. ............... 365/185.17 |
| 2003/0115518 A1 * | 6/2003 | Kleveland et al. ............ 714/718 |
| 2007/0034908 A1 | 2/2007 | Cho et al. |

(Continued)

FOREIGN PATENT DOCUMENTS

| CN | 1921013 A | 2/2007 |
| WO | 2013/101196 A1 | 7/2013 |

OTHER PUBLICATIONS

International Search Report and Written Opinion received for PCT Application No. PCT/US2011/068139, mailed on Sep. 24, 2012, 9 pages.

(Continued)

*Primary Examiner* — Guerrier Merant
(74) *Attorney, Agent, or Firm* — Alpine Technology Law Group LLC

(57) ABSTRACT

Methods and apparatus related to PCMS (Phase Change Memory with Switch) write error detection are described. In one embodiment, a first storage unit stores a single bit to indicate whether an error corresponding to a write operation in any of one or more PCMS devices has occurred. Also, one or more storage units each store a plurality of bits to indicate whether the error corresponding to the write operation has occurred in a partition of a plurality of partitions of the one or more PCMS devices. Other embodiments are also disclosed and claimed.

26 Claims, 5 Drawing Sheets

(56) References Cited

U.S. PATENT DOCUMENTS

| | | |
|---|---|---|
| 2009/0300467 A1 | 12/2009 | Parkinson |
| 2010/0037005 A1 | 2/2010 | Kim et al. |
| 2010/0124104 A1 | 5/2010 | Sato et al. |
| 2010/0250798 A1 | 9/2010 | Eilert |
| 2010/0293317 A1 | 11/2010 | Confalonieri et al. |
| 2011/0214025 A1* | 9/2011 | Seko .......................... 714/720 |
| 2011/0271165 A1 | 11/2011 | Bueb et al. |
| 2013/0013977 A1* | 1/2013 | Rivers et al. ................ 714/763 |
| 2013/0179751 A1* | 7/2013 | Linstadt ...................... 714/763 |

OTHER PUBLICATIONS

International Preliminary Report on Patentability and Written Opinion received for PCT Patent Application No. PCT/US2011/068139, mailed on Jul. 10, 2014, 6 Pages.

Office Action received for Chinese Patent Application No. 201180076016.5, mailed on Dec. 31, 2015, 12 pages.

* cited by examiner

| Status Registers | Address-SR Bit | Name | Description |
|---|---|---|---|
| SR0 | SR0[0] | Write Failure | 0= No failure (default)<br>1 = Write failure |
| SR1 | SR1[7-0] | Partition address for write failure | Partition Address for most recent write failure per partition<br>SR[0] =>Partition 0 (0=default)<br>SR[1] => Partition 1 (0=default)<br>SR[2] => Partition 2 (0=default)<br>SR[3] => Partition 3 (0=default)<br>SR[4] =>Partition 4(0=default)<br>SR[5] => Partition 5 (0=default)<br>SR[6] => Partition 6 (0=default)<br>SR[7] => Partition 7 (0=default) |
| SR2 | SR2[7:0] | Partition address for write failure | Partition Address for most recent write failure per partition<br>SR[0] =>Partition 8 (0=default)<br>SR[1] => Partition 9 (0=default)<br>SR[2] => Partition 10 (0=default)<br>SR[3] => Partition 11 (0=default)<br>SR[4] =>Partition 12(0=default)<br>SR[5] => Partition 13 (0=default)<br>SR[6] => Partition 14 (0=default)<br>SR[7] => Partition 15 (0=default) |

FIG. 3

PHASE CHANGE MEMORY WITH SWITCH (PCMS) WRITE ERROR DETECTION

FIELD

The present disclosure generally relates to the field of electronics. More particularly, some embodiments of the invention generally relate to PCMS (Phase Change Memory with Switch) write error detection.

BACKGROUND

As processing capabilities are enhanced in processors, one concern is the speed at which memory may be accessed by a processor. For example, to process data, a processor may need to first fetch data from a memory. After completion of the data processing, the results may need to be stored in the memory. Therefore, the memory speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices as excess power consumption may increase costs (e.g., due to additional power usage, increasing cooling requirements, etc.), shorten component life, limit locations at which a device may be used, etc.

Hard disk drives provide a relatively low-cost storage solution and are used in many computing devices to provide non-volatile storage. Disk drives however use a lot of power when compared to flash memory since a disk drive needs to spin its disks at a relatively high speed and move disk heads relative to the spinning disks to read/write data. All this physical movement generates heat and increases power consumption. To this end, some higher end mobile devices are migrating towards flash memory devices that are non-volatile. However, flash memory has a number of drawbacks including, for example, relatively large voltage level requirement to change bit states, delay in write times due to requirement of a charge pump ramp up, having to erase a block of cells at a time, etc.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

FIG. 3 illustrates contents of status registers according to some embodiments.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Phase Change Memory With Switch (PCMS) is another type of non-volatile memory that may provide higher performance and/or endurance when compared to a flash memory device. For example, PCMS allows a single bit to be changed without needing to first erase an entire block of cells, PCMS structure may degrade more slowly, PCMS data state may be retrained for a relatively longer period, and PCMS is more scalable.

Some embodiments relate to efficient write error detection in PCMS devices. The embodiments discussed herein are however not limited to PCMS and may be applied to any type of write in-place non-volatile memory such as Phase Change Memory (PCM). Accordingly, the terms "PCMS" and "PCM" may be interchangeable herein. Moreover, PCMS may be used in computing platforms as memory or a storage subsystem with high capacity. Each PCMS device may include multiple partitions and there may be multiple write operations issued to these multiple partitions in parallel. If any of the write operations fail, the failure needs to be efficiently handled to reduce latency and/or improve performance. To this end an embodiment improves PCMS controller efficiency by allowing the controller to quickly determine the source of a write failure and take corrective action(s).

Figure 1:
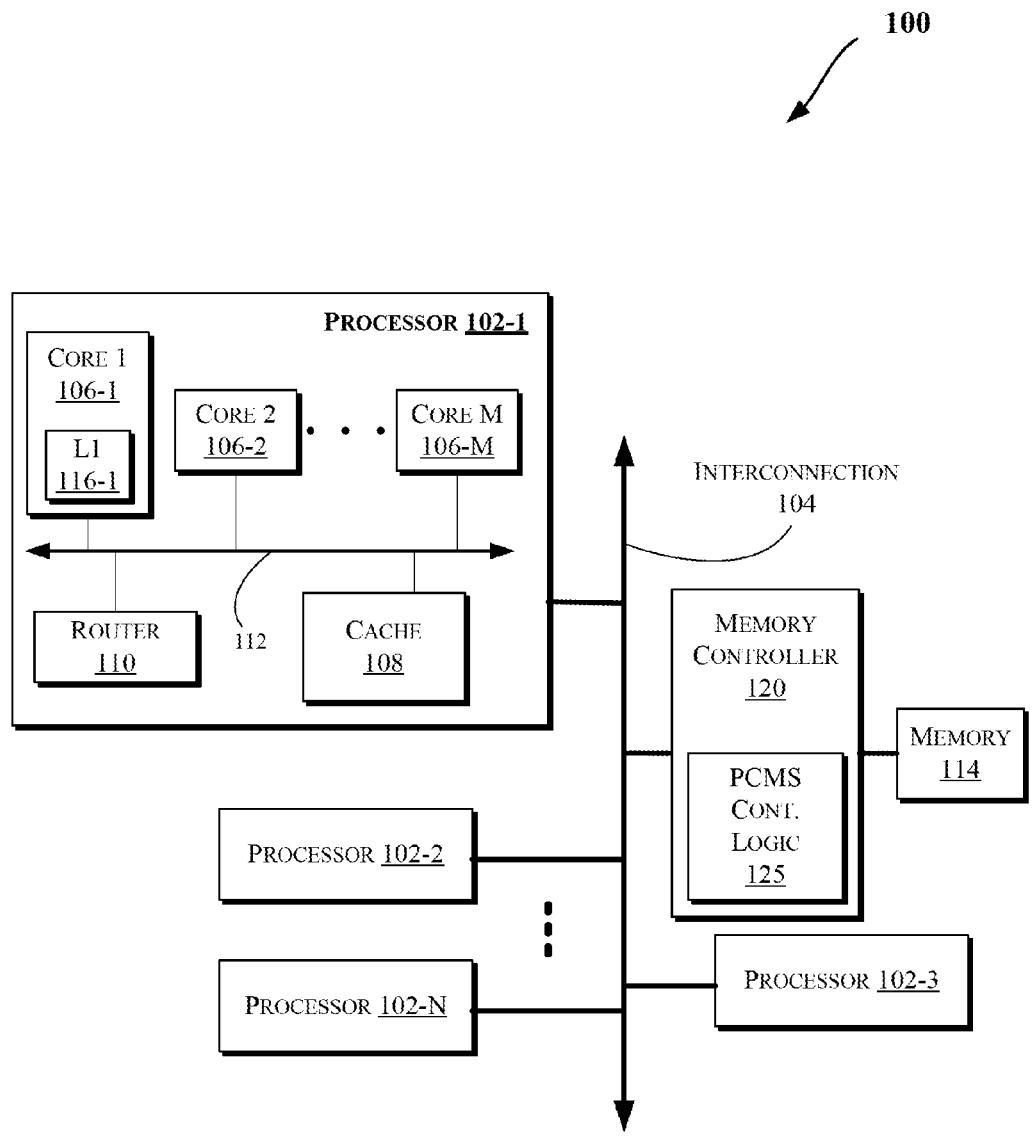
FIGS. 1, 4, and 5 illustrate block diagrams of embodiments of computing systems, which may be utilized to implement various embodiments discussed herein.

Moreover, the memory techniques discussed herein may be provided in various computing systems (e.g., including smart phones, tablets, portable game consoles, Ultra-Mobile Personal Computers (UMPCs), etc.), such as those discussed with reference to FIGS. 1-5. More particularly, FIG. 1 illustrates a block diagram of a computing system 100, according to an embodiment of the invention. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), memory controllers (such as those discussed with reference to FIGS. 4-5), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a memory 114 for faster access by the components of the processor 102. As shown in FIG. 1, the memory 114 may be in communication with the processors 102 via the interconnection 104. In an embodiment, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 1, memory 114 may be coupled to other components of system 100 through a memory controller 120. Memory 114 may include non-volatile memory such as PCMS memory in some embodiments. Even though the memory controller 120 is shown to be coupled between the interconnection 102 and the memory 114, the memory controller 120 may be located elsewhere in system 100. For example, memory controller 120 or portions of it may be provided within one of the processors 102 in some embodiments. Also, in some embodiments, system 100 may include logic (e.g., PCMS controller logic 125) to issue read or write requests to the memory 114 in an optimal fashion.

Figure 2:
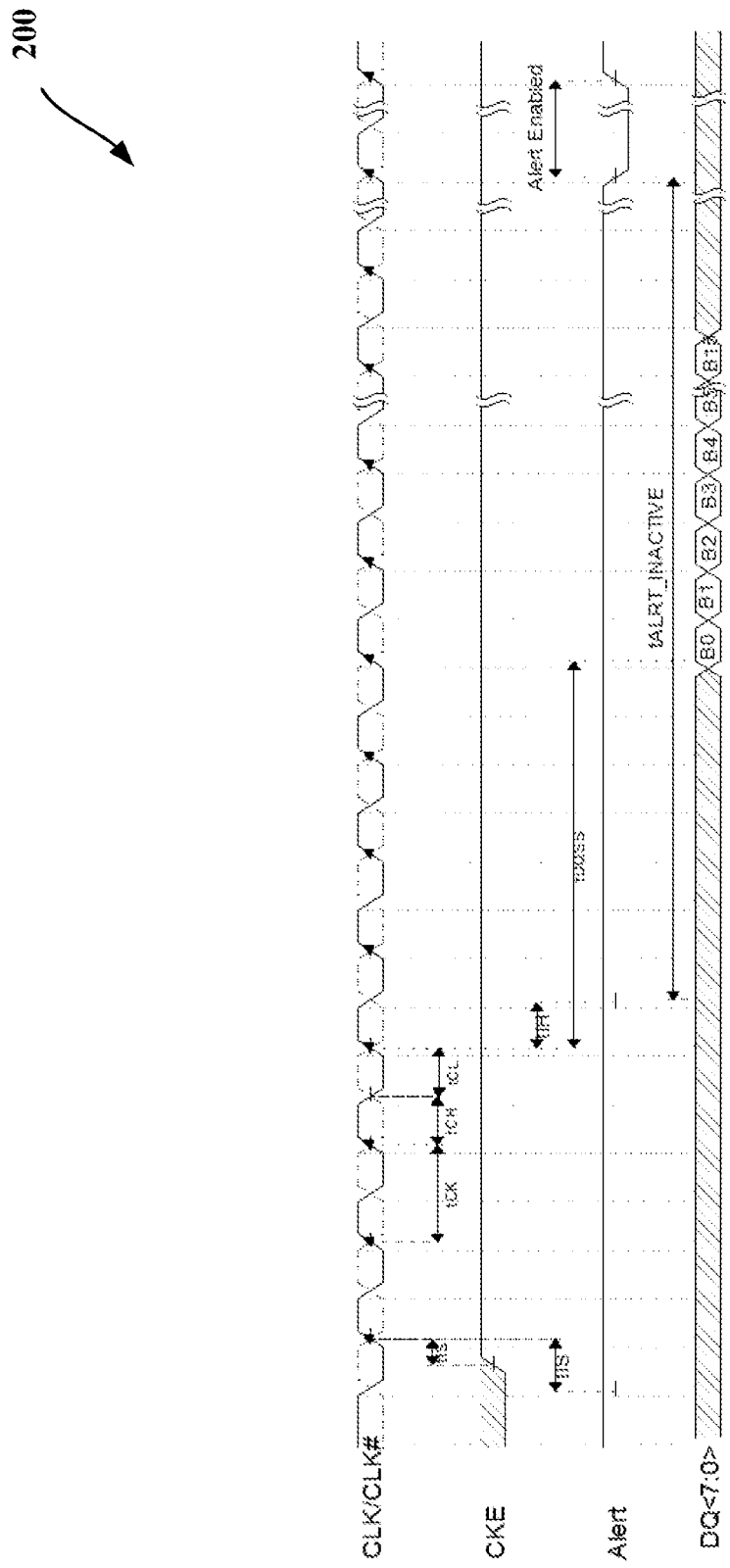
FIG. 2 illustrates a timing diagram according to an embodiment.

FIG. 2 illustrates a timing diagram 200, according to an embodiment. As shown in FIG. 2, an Alert (error) pin is asserted upon write failure after a deterministic delay. In FIG. 2, CLK/CLK# refers to a clock signal (where tIS refers to setup time to clock, tCK refers to clock period, tCH refers to high clock, tCL refers to low clock, CKE refers to clock enable (where tIS refers to setup time to clock, tIH refers to hold time from clk edge, tALRT_INACTIVE refers to deterministic time while write is supposed to be completed, and DQ refers to Output pins (where B0-B15 refer to bytes 0 to 15 of data).

FIG. 3 illustrates contents of status registers 300, according to some embodiments. As shown, a first Status Register (SR) 0 may include a single bit to indicate whether a write failure has occurred. Also, while "0" indicates no write failure and "1" indicates a write failure, the reverse of the same indicators may also be used depending on the implementation. Also, depending on the implementation, the registers shown in FIG. 3 may be implemented as separate registers, portions of a single register, locations in a cache (e.g., cache 116 and/or 108), locations within a dedicated memory, locations within a shared memory device (e.g., memory 114), etc.

Moreover, one or more status registers (e.g., SR1 and SR2) may each have a plurality of bits to indicate a partition address for write failure(s) in partitions of PCMS devices or PCMS Integrated Circuit (IC) die(s). Even though 8 bits are shown for SR1 and SR2, more or less bits may be used depending on the number of partitions. Also, while "0" indicates no write failure and "1" indicates a write failure in SR1 and SR2, the reverse of the same indicators may also be used depending on the implementation.

As discussed with reference to FIGS. 2-3, some embodiments allow large numbers of PCMS partitions across one or multiple PCMS dies to be written simultaneously. A PCMS controller (e.g., logic 125) may determine if there are any write failures based on assertion of an error pin deterministically, In one embodiment, the PCMS controller may be allowed to de-assert the pin. This is important since one PCMS controller 125 may operate multiple PCMS devices in various embodiments.

Accordingly, in some embodiments, a PCMS die (with multiple PCMS devices and/or partitions) shares a single open drain Alert (error) pin with external pull up that may be asserted by die PCMS device(s)/partition(s) at a deterministic time upon write (program fail) such as discussed with reference to FIG. 3. The pin may remain asserted until indicated by the PCMS controller 125 to be de-asserted. Status registers (such as the ones discussed with reference to FIG. 3) include an error bit to indicate a write failure and also partition address(es) of failed write operation(s). The PCMS controller 125 will have the ability to write to the error bit in order to clear it which causes the Alert (error) pin to internally be de-asserted.

Moreover, when multiple PCMS are used in a platform, the Alert (error) pin may be shared among all PCMS dies/devices (e.g., logically ORed). Upon any write failure, PCMS die/device asserts the Alert pin indicating to the PCMS controller 125 that a writer operation failure has occurred. This helps the PCMS controller 125 to not have to continuously keep polling the read status register or PCMS array location to determine whether a write operation has been done successfully. Also, there may be only one write operation per partition allowed, so by indicating the partition failure (e.g., per SR1 or SR2 of FIG. 3), the PCMS controller 125 may determine which write operation has failed. In case of multiple failures per die (e.g., across multiple partitions), all the failures may be indicated in the PCMS status registers 1 and 2 (i.e., SR1 and SR2 in FIG. 3). The PCMS controller 125 may de-assert the Alert pin by writing 0 to bit 0 of status register 0 (i.e., SR0 in FIG. 3) and may clear status registers 1 and 2. If multiple dies have asserted Alert pin, then bit 0 of each status register of each PCMS die with failure is written to de-assert the Alert pin. Furthermore, the Alert pin assertion may occur on a deterministic time interval after a write command is issued as shown in FIG. 2.

Additionally, various embodiments provide an open drain error pin that once asserted will remain asserted, where the details regarding one or more write operation error(s) are represented in one or more status register(s), and the PCMS controller 125 has the ability to de-assert the error pin per each PCMS device in a multi-PCMS device platform. Accordingly, some embodiments utilize a single PCMS controller to operate multiple PCMS devices and detect write errors. This feature combined with PCMS memory's high write bandwidth and scalability reduces or eliminates high polling overhead on the PCMS controller which sacrifice of performance.

Figure 4:
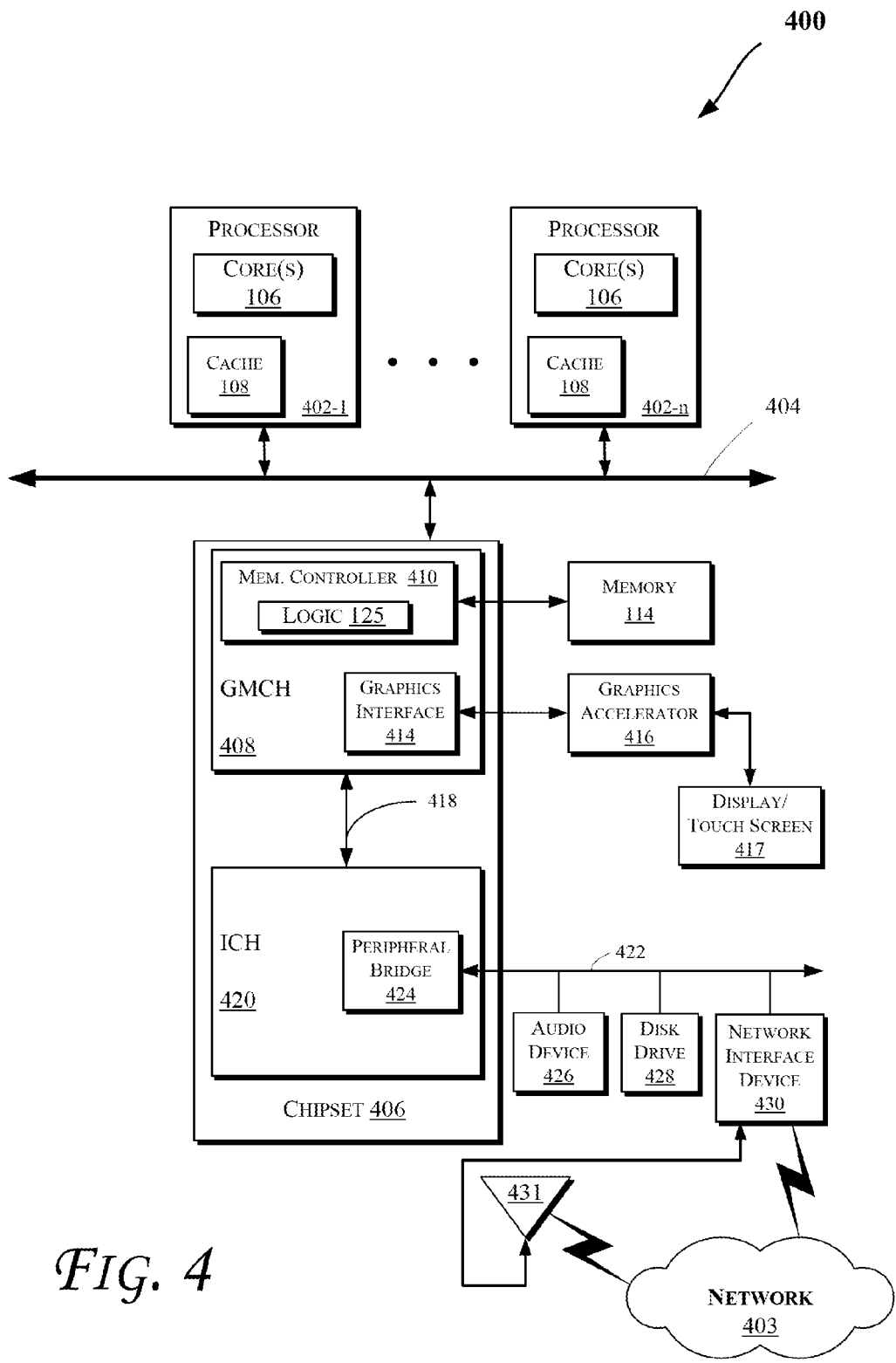

FIG. 4 illustrates a block diagram of a computing system 400 in accordance with an embodiment of the invention. The computing system 400 may include one or more central processing unit(s) (CPUs) 402 or processors that communicate via an interconnection network (or bus) 404. The processors 402 may include a general purpose processor, a network processor (that processes data communicated over a computer network 403), an application processor (such as those used in cell phones, smart phones, etc.), or other types of a processor (including a reduced instruction set computer (RISC) processor or a complex instruction set computer (CISC)). Various types of computer networks 803 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 4G, Low Power Embedded (LPE), etc.). Moreover, the processors 402 may have a single or multiple core design. The processors 402 with a multiple core design may integrate different types of processor cores on the same integrated circuit (IC) die. Also, the processors 402 with a multiple core design may be implemented as symmetrical or asymmetrical multiprocessors.

In an embodiment, one or more of the processors 402 may be the same or similar to the processors 102 of FIG. 1. For example, one or more of the processors 402 may include one or more of the cores 106 and/or cache 108. Also, the operations discussed with reference to FIGS. 1-3 may be performed by one or more components of the system 400.

A chipset 406 may also communicate with the interconnection network 404. The chipset 406 may include a graphics and memory control hub (GMCH) 408. The GMCH 408 may include a memory controller 410 (which may be the same or similar to the memory controller 120 of FIG. 1 in an embodiment, e.g., including the logic 125) that communicates with the memory 114. The memory 114 may store data, including sequences of instructions that are executed by the CPU 402, or any other device included in the computing system 400. In one embodiment of the invention, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 404, such as multiple CPUs and/or multiple system memories.

The GMCH 408 may also include a graphics interface 414 that communicates with a graphics accelerator 416. In one embodiment of the invention, the graphics interface 414 may communicate with the graphics accelerator 416 via an accelerated graphics port (AGP). In an embodiment of the invention, a display 417 (such as a flat panel display, touch screen, etc.) may communicate with the graphics interface 414 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display 417.

A hub interface 418 may allow the GMCH 408 and an input/output control hub (ICH) 420 to communicate. The ICH 420 may provide an interface to I/O devices that communicate with the computing system 400. The ICH 420 may communicate with a bus 422 through a peripheral bridge (or controller) 424, such as a peripheral component interconnect (PCI) bridge, a universal serial bus (USB) controller, or other types of peripheral bridges or controllers. The bridge 424 may provide a data path between the CPU 402 and peripheral devices. Other types of topologies may be utilized. Also, multiple buses may communicate with the ICH 420, e.g., through multiple bridges or controllers. Moreover, other peripherals in communication with the ICH 420 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 422 may communicate with an audio device 426, one or more disk drive(s) 428, and a network interface device 430 (which is in communication with the computer network 403, e.g., via a wired or wireless interface). As shown, the network interface device 430 may be coupled to an antenna 431 to wirelessly (e.g., via an Institute of Electrical and Electronics Engineers (IEEE) 802.11 interface (including IEEE 802.11a/b/g/n, etc.), cellular interface, 3G, 4G, LPE, etc.) communicate with the network 403. Other devices may communicate via the bus 422. Also, various components (such as the network interface device 430) may communicate with the GMCH 408 in some embodiments of the invention. In addition, the processor 402 and the GMCH 408 may be combined to form a single chip. Furthermore, the graphics accelerator 416 may be included within the GMCH 408 in other embodiments of the invention.

Furthermore, the computing system 400 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 428), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 5:
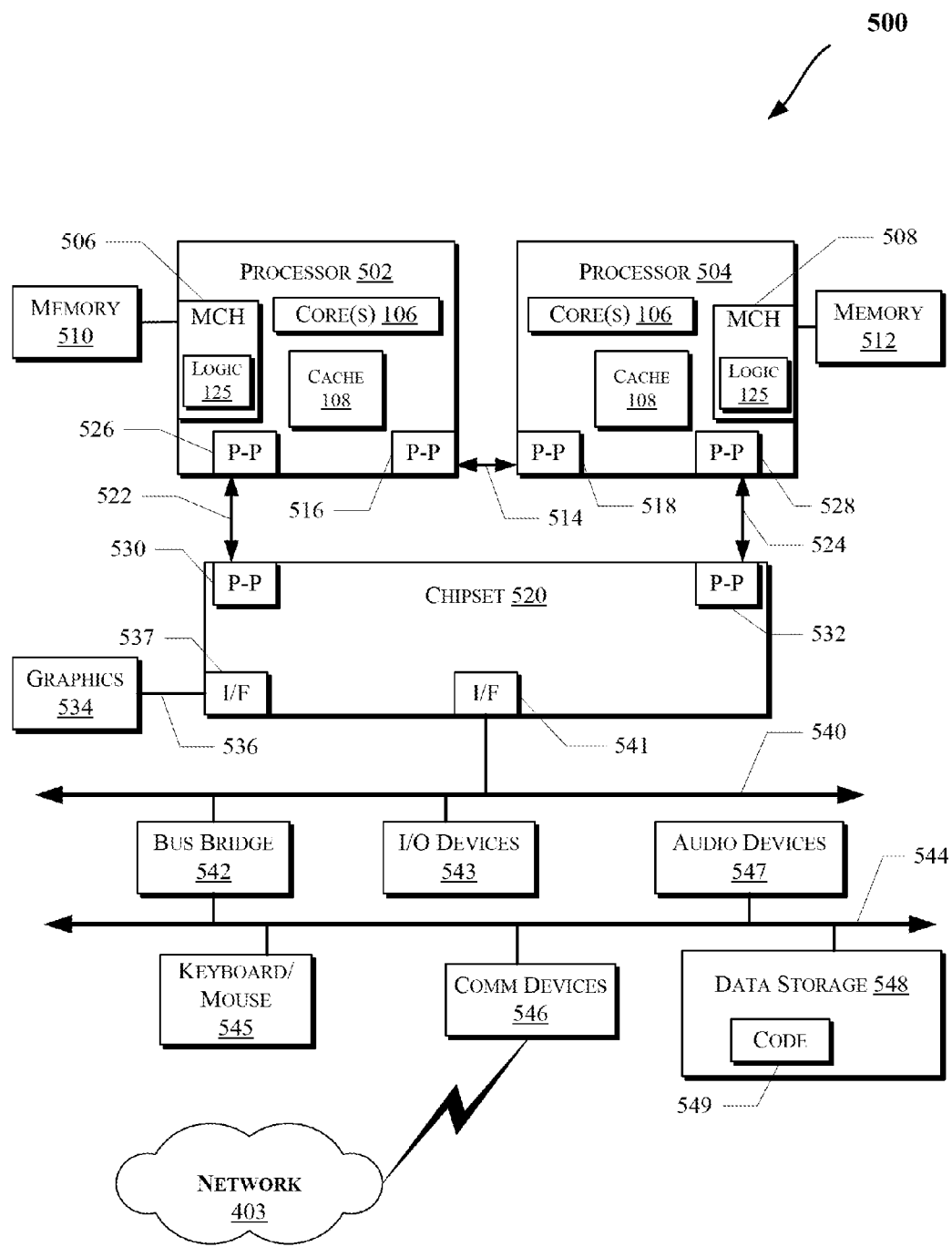

FIG. 5 illustrates a computing system 500 that is arranged in a point-to-point (PtP) configuration, according to an embodiment of the invention. In particular, FIG. 5 shows a system where processors, memory, and input/output devices are interconnected by a number of point-to-point interfaces. The operations discussed with reference to FIGS. 1-4 may be performed by one or more components of the system 500.

As illustrated in FIG. 5, the system 500 may include several processors, of which only two, processors 502 and 504 are shown for clarity. The processors 502 and 504 may each include a local memory controller hub (MCH) 506 and 508 to enable communication with memories 510 and 512. The memories 510 and/or 512 may store various data such as those discussed with reference to the memory 114 of FIGS. 1 and/or 4. Also, MCH 506 and 508 may include the memory controller 120 and/or logic 125 of FIG. 1 in some embodiments.

In an embodiment, the processors 502 and 504 may be one of the processors 402 discussed with reference to FIG. 4. The processors 502 and 504 may exchange data via a point-to-point (PtP) interface 514 using PtP interface circuits 516 and 518, respectively. Also, the processors 502 and 504 may each exchange data with a chipset 520 via individual PtP interfaces 522 and 524 using point-to-point interface circuits 526, 528, 530, and 532. The chipset 520 may further exchange data with a high-performance graphics circuit 534 via a high-performance graphics interface 536, e.g., using a PtP interface circuit 537. As discussed with reference to FIG. 4, the graphics interface 536 may be coupled to a display device (e.g., display 417) in some embodiments.

As shown in FIG. 5, one or more of the cores 106 and/or cache 108 of FIG. 1 may be located within the processors 502 and 504. Other embodiments of the invention, however, may exist in other circuits, logic units, or devices within the system 500 of FIG. 5. Furthermore, other embodiments of the invention may be distributed throughout several circuits, logic units, or devices illustrated in FIG. 5.

The chipset 520 may communicate with a bus 540 using a PtP interface circuit 541. The bus 540 may have one or more devices that communicate with it, such as a bus bridge 542 and I/O devices 543. Via a bus 544, the bus bridge 543 may communicate with other devices such as a keyboard/mouse 545, communication devices 546 (such as modems, network interface devices, or other communication devices that may communicate with the computer network 403, as discussed with reference to network interface device 430 for example, including via antenna 431), audio I/O device, and/or a data storage device 548. The data storage device 548 may store code 549 that may be executed by the processors 502 and/or 504.

In various embodiments of the invention, the operations discussed herein, e.g., with reference to FIGS. 1-5, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-5.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
Phase Change Memory (PCM) controller logic to control access to one or more PCM devices;
a first storage unit to store a single bit to indicate whether an error corresponding to a write operation in any of the one or more PCM devices has occurred; and
one or more storage units to each store a plurality of bits to indicate whether the error corresponding to the write operation has occurred in a partition of a plurality of partitions of the one or more PCM devices, wherein any one of the one or more PCM devices is capable to assert the single bit, wherein once the single bit is asserted, only the PCM controller logic is capable to de-assert the single bit.

2. The apparatus of claim 1, wherein the one or more PCM devices are to assert a signal on an error pin to cause the single bit to be updated to indicate the error.

3. The apparatus of claim 1, wherein each of the one or more PCM devices are to assert a signal on an error pin to cause one of the plurality of bits of the one or more storage units to be updated to indicate the error in the partition.

4. The apparatus of claim 1, wherein each of the one or more PCM devices are to assert a signal on an error pin to cause at least two of the plurality of bits of the one or more storage units to be updated to indicate the error in the partition and another partition of the one or more PCM devices.

5. The apparatus of claim 1, wherein the one or more PCM devices are on a same integrated circuit die.

6. The apparatus of claim 1, wherein the PCM controller logic is to update the single bit to de-assert the error.

7. The apparatus of claim 1, wherein the one or more PCM devices are to assert a signal on an error pin to indicate the error, wherein the error pin assertion is to occur on a deterministic time interval after a write command is issued to the one or more PCM devices by the PCM controller logic.

8. The apparatus of claim 1, wherein one or more of the PCM controller logic, a memory, the one or more PCM devices, and a processor core are on a same integrated circuit die.

9. The apparatus of claim 1, wherein a memory controller is to comprise the PCM controller logic.

10. The apparatus of claim 1, wherein the first storage unit is to comprise a status register.

11. The apparatus of claim 1, wherein the one or more storage units are to comprise one or more status registers.

12. A method comprising:
storing a single bit in a first storage unit to indicate whether an error corresponding to a write operation in any of one or more PCM devices has occurred; and
storing a plurality of bits in each of one or more storage units to indicate whether the error corresponding to the write operation has occurred in a partition of a plurality of partitions of the one or more PCM devices, wherein any one of the one or more PCM devices is capable to assert the single bit, wherein once the single bit is asserted, only a PCM controller logic is capable to de-assert the single bit.

13. The method of claim 12, further comprising the PCM controller logic controlling access to the one or more PCM devices.

14. The method of claim 12, further comprising the one or more PCM devices asserting a signal on an error pin to cause the single bit to be updated to indicate the error.

15. The method of claim 12, further comprising the one or more PCM devices asserting a signal on an error pin to cause one of the plurality of bits of the one or more storage units to be updated to indicate the error in the partition.

16. The method of claim 12, further comprising the one or more PCM devices asserting a signal on an error pin to cause at least two of the plurality of bits of the one or more storage units to be updated to indicate the error in the partition and another partition of the one or more PCM devices.

17. The method of claim 12, further comprising updating the single bit to de-assert the error.

18. The method of claim 12, further comprising the one or more PCM devices asserting a signal on an error pin to indicate the error, wherein the error pin assertion is to occur on a deterministic time interval after a write command is issued to the one or more PCM devices by the PCM controller logic.

19. The method of claim 12, wherein the first storage unit or the one or more storage units are to comprise one or more status registers.

20. A system comprising:
one or more PCM devices;
a processor to access data stored on the one or more PCM devices via a PCM controller logic;
a first storage unit to store a single bit to indicate whether an error corresponding to a write operation in any of the one or more PCM devices has occurred; and
one or more storage units to each store a plurality of bits to indicate whether the error corresponding to the write operation has occurred in a first partition of a plurality of partitions of the one or more PCM devices, wherein any one of the one or more PCM devices is capable to assert the single bit, wherein once the single bit is asserted, only the PCM controller logic is capable to de-assert the single bit.

21. The system of claim 20, wherein the one or more PCM devices are to assert a signal on an error pin to cause the single bit to be updated to indicate the error.

22. The system of claim 20, wherein each of the one or more PCM devices are to assert a signal on an error pin to cause one of the plurality of bits of the one or more storage units to be updated to indicate the error in the partition.

23. The system of claim 20, wherein each of the one or more PCM devices are to assert a signal on an error pin to cause at least two of the plurality of bits of the one or more storage units to be updated to indicate the error in the partition and another partition of the one or more PCM devices.

24. The system of claim 20, wherein the one or more PCM devices are on a same integrated circuit die.

25. The system of claim 20, wherein the PCM controller logic is to update the single bit to de-assert the error.

26. The apparatus of claim 1, wherein the one or more storage units are to comprise one or more status registers, wherein each of the one or more status registers is to at least store the single bit and an address of the partition of the plurality of partitions of the one or more PCM devices.

* * * * *